(12) United States Patent
Hsin et al.

(10) Patent No.: US 9,761,725 B2
(45) Date of Patent: Sep. 12, 2017

(54) THIN FILM TRANSISTOR DISPLAY DEVICE WITH ZINC NITRIDE OHMIC CONTACT LAYER

(71) Applicant: BOE TECHNOLOGY GROUP CO., LTD., Beijing (CN)

(72) Inventors: Lung Pao Hsin, Beijing (CN); Fengjuan Liu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/307,362

(22) PCT Filed: Feb. 27, 2015

(86) PCT No.: PCT/CN2015/073358
§ 371 (c)(1),
(2) Date: Oct. 27, 2016

(87) PCT Pub. No.: WO2016/058312
PCT Pub. Date: Apr. 21, 2016

(65) Prior Publication Data
US 2017/0047451 A1   Feb. 16, 2017

(30) Foreign Application Priority Data
Oct. 15, 2014   (CN) .......................... 2014 1 0546475

(51) Int. Cl.
*H01L 29/786*   (2006.01)
*H01L 27/12*   (2006.01)
(Continued)

(52) U.S. Cl.
CPC .... *H01L 29/78618* (2013.01); *H01L 27/1225* (2013.01); *H01L 29/24* (2013.01);
(Continued)

(58) Field of Classification Search
CPC .. H01L 29/45; H01L 29/7869; H01L 27/1225
See application file for complete search history.

(56) References Cited

U.S. PATENT DOCUMENTS 7,071,045 B2 *   7/2006   Wu ................... H01L 29/66765
                                                                257/288
7,994,510 B2 *   8/2011   Jeong ................. H01L 27/1225
                                                                257/72
(Continued)

FOREIGN PATENT DOCUMENTS

CN    101414564 A    4/2009
CN    102890378 A    1/2013
(Continued)

OTHER PUBLICATIONS

Ye et al., "High mobility amorphous zinc oxynitride semiconductor material for thin film transistors", Oct. 2009, Journal of Applied Physics,106, 07512, (8 pp).*
(Continued)

*Primary Examiner* — Evan Pert
(74) *Attorney, Agent, or Firm* — Kinney & Lange, P.A.

(57) ABSTRACT

Embodiments of the present invention relates to a thin film transistor and a method for manufacturing the same, a display substrate and a display device. The thin film transistor comprises an active layer, a source electrode, a drain electrode and an ohmic contact layer, wherein the ohmic contact layer is disposed between the active layer and the source electrode and/or between the active layer and the drain electrode to improve an ohmic contact property of the active layer with the source electrode and/or the drain electrode. The present invention solves the problem of poor ohmic contact effect between the active layer and the source and drain electrodes in the existing thin film transistor, thereby improving the ohmic contact property of the active
(Continued)

layer with the source and drain electrodes and meanwhile improving display effect of images of a display.

18 Claims, 3 Drawing Sheets

(51) Int. Cl.
    *H01L 29/45*     (2006.01)
    *H01L 29/24*     (2006.01)
    *H01L 29/66*     (2006.01)

(52) U.S. Cl.
    CPC ........ *H01L 29/45* (2013.01); *H01L 29/66969* (2013.01); *H01L 29/786* (2013.01); *H01L 29/7869* (2013.01); *H01L 29/78696* (2013.01)

(56) References Cited

U.S. PATENT DOCUMENTS

| | | | | |
|---|---|---|---|---|
| 8,609,460 B2* | 12/2013 | Liu | .............. | H01L 29/78606 257/43 |
| 8,829,515 B2* | 9/2014 | Seon | .............. | H01L 29/66969 257/43 |
| 2012/0007086 A1* | 1/2012 | Oh | .............. | H01L 29/458 257/59 |
| 2015/0034942 A1* | 2/2015 | Kim | .............. | H01L 29/7869 257/43 |
| 2015/0060990 A1* | 3/2015 | Kim | .............. | H01L 29/7869 257/324 |
| 2015/0214373 A1* | 7/2015 | Zhang | .............. | H01L 29/7869 257/72 |

FOREIGN PATENT DOCUMENTS

| | | |
|---|---|---|
| CN | 103199112 A | 7/2013 |
| CN | 103474356 A | 12/2013 |
| CN | 104362180 A | 2/2015 |

OTHER PUBLICATIONS

Jiang et al., "Zinc nitride films prepared by reactive RF magnetron sputtering of zinc in nitrogen containing atmosphere", Mar. 2012, J. Phys. D: Appl. Phys. 45 (2012) 135101 (9 pp).*

English Translation of International Search Report and Written Opinion dated Jul. 29, 2015, for corresponding PCT Application No. PCT/CN2015/073358.

First Office Action dated Sep. 27, 2016, for corresponding Chinese Application No. 201410546475.0.

* cited by examiner

THIN FILM TRANSISTOR DISPLAY DEVICE WITH ZINC NITRIDE OHMIC CONTACT LAYER

CROSS-REFERENCE TO RELATED APPLICATION

This application is a national-phase application of PCT International Application No. PCT/CN2015/073358 filed on Feb. 27, 2015, and claims the benefit of Chinese Patent Application No. 201410546475.0 filed on Oct. 15, 2014 in the State Intellectual Property Office of China, the disclosures of which are incorporated herein by reference to their entirety.

BACKGROUND OF THE INVENTION

Field of the Invention

Embodiments of the present invention relate to field of display technique, particularly to a thin film transistor and a method for manufacturing the same, a display substrate and a display device.

Description of the Related Art

In an existing thin film transistor, typically, a semiconductor active layer is made of metallic oxide semiconductor material, which, however, cannot adapt well to various manufacturing conditions of different manufacturing processes and problems such as low electron mobility, poor ohminc contact property will occur. Meanwhile, the semiconductor active layer may be damaged, even losing a semiconductor property due to influences of manufacturing environments, plasma treatments, pollution treatments and the like in different manufacturing processes.

In order to solve the above problems, it has been proposed to make the semiconductor active layer by using zinc oxynitride material instead of metallic oxide material. However, the ohmic contact property of the zinc oxynitride is poor. The semiconductor active layer formed by the zinc oxynitride has poor ohmic contact effect with source and drain electrodes. Thus, a poor electrical connection between the source and drain electrodes and the semiconductor active layer may be incurred when power is supplied, which may result in a signal delay, thereby affecting image display effect of a display.

SUMMARY OF THE INVENTION

Embodiments of the present invention provide a thin film transistor and a method for manufacturing the same, a display substrate and a display device, which can solve the problem of poor ohmic contact property between an active layer of a zinc oxynitride material and a source/drain electrode in an existing thin film transistor, improving the ohmic contact property of the active layer with the source and drain electrodes. Meanwhile, image display effect of a display is improved.

In one aspect of the present invention, there is provided a thin film transistor comprising an active layer, a source electrode, a drain electrode, and an ohmic contact layer disposed between the active layer and the source electrode and/or between the active layer and the drain electrode to improve an ohmic contact property between the active layer and the source electrode and/or between the active layer and the drain electrode.

According to an exemplary embodiment of the present invention, the active layer is made of zinc oxynitride, and the ohimc contact layer is made of zinc nitride.

According to an exemplary embodiment of the present invention, the thin film transistor further comprises a gate insulation layer and a gate electrode, wherein the active layer is disposed on a substrate; the gate insulation layer is disposed on the active layer to partially expose the active layer; the gate electrode is disposed on the gate insulation layer at a position corresponding to the gate insulation layer; the ohmic contact layer is disposed on the exposed active layer; and the source electrode and the drain electrode are disposed on the ohmic contact layer.

According to an exemplary embodiment of the present invention, the thin film transistor further comprises a finishing layer, wherein the finishing layer is disposed on the ohmic contact layer and provided with via holes therein at positions corresponding to the source electrode and the drain electrode; and the finishing layer is made of metallic or nonmetallic nitride.

According to an exemplary embodiment of the present invention, the active layer has a thickness of 200-1500 Å.

According to an exemplary embodiment of the present invention, each of the source electrode and the drain electrode has a thickness of 50-100 Å.

According to an exemplary embodiment of the present invention, the ohmic contact layer has a thickness less than 50 Å.

According to an exemplary embodiment of the present invention, the finishing layer has a thickness of 30-300 Å.

In a second aspect of the present invention, there is provided a method for manufacturing a thin film transistor comprising an active layer, a source electrode and a drain electrode, the method comprising: forming an ohmic contact layer between the active layer and the source electrode and/or between the active layer and the drain electrode.

According to an exemplary embodiment of the present invention, the active layer is made of zinc oxynitride, and the ohmic contact layer is made of zinc nitride.

According to an exemplary embodiment of the present invention, the method comprises: forming the active layer on a substrate by using zinc oxynitride material; forming a gate insulation layer on the active layer to partially expose the active layer; forming a gate electrode on the gate insulation layer to cover the gate insulation layer; forming the ohmic contact layer on the exposed active layer; and forming the source electrode and the drain electrode on the ohmic contact layer.

According to an exemplary embodiment of the present invention, the forming an ohmic contact layer between the active layer and the source electrode and/or between the active layer and the drain electrode comprises: forming a nitride thin film between the active layer and the source and drain electrodes by using a metallic or nonmetallic nitride material so that a nitride in the nitride thin film reacts with the zinc oxynitride in the active layer to form the ohmic contact layer.

According to an exemplary embodiment of the present invention, the forming an ohmic contact layer between the active layer and the source electrode and/or between the active layer and the drain electrode comprises: forming the ohmic contact layer between the active layer and the source electrode and/or between the active and the drain electrode directly by using a zinc nitride material.

According to an exemplary embodiment of the present invention, the method further comprises forming the gate insulation layer and the gate electrode through a single patterning process.

In a third aspect of the present invention, there is provided a display substrate comprising the thin film transistor in any one of the above embodiments of the one aspect of the present invention.

In a fourth aspect of the present invention, there is provided a display device comprising the display substrate in any one of the above embodiments of the third aspect of the present invention.

With the thin film transistor and the method for manufacturing the same, the display substrate and the display device according to the embodiments of the present invention, the ohmic contact layer made of the zinc nitride is formed between the active layer and the source electrode and/or between the active layer and the drain electrode. Since the zinc nitride material has a good ohmic contact property, the ohmic contact layer made of zinc nitride will provide a good ohmic contact property between the source and drain electrodes and the active layer. Therefore, it is possible to solve the problem of poor ohmic contact effect between the active layer of zinc oxynitride and the source and drain electrodes in the prior art, thereby improving the ohmic contact property between the active layer and the source and drain electrodes in the existing thin film transistor. Thus, the image display effect of a display can be improved.

Further, compared to the prior art in which the gate electrode must have a larger area than that of the active layer in order to ensure the performance of the thin film transistor, in embodiments of the present invention, since the ohmic contact layer is additionally provided, an area of the gate electrode is greatly reduced compared to that of the prior art, which can in turn effectively reduce an area of the active layer such that a parasitic capacitance between the source and drain electrodes and the gate electrode is reduced. Therefore, it is possible to further improve image display effect of a display.

BRIEF DESCRIPTION OF THE DRAWINGS

The accompanying drawings of the embodiments of the present invention or the prior art will be briefly described below to more clearly illustrate the technical solutions of the embodiments of the present invention. Obviously, the accompanying drawings merely reflect some of the embodiments of the present invention. Other drawings may be obtained by those skilled in the art based on these drawings without any inventive step.

REFERENCE LIST

Figure 1:
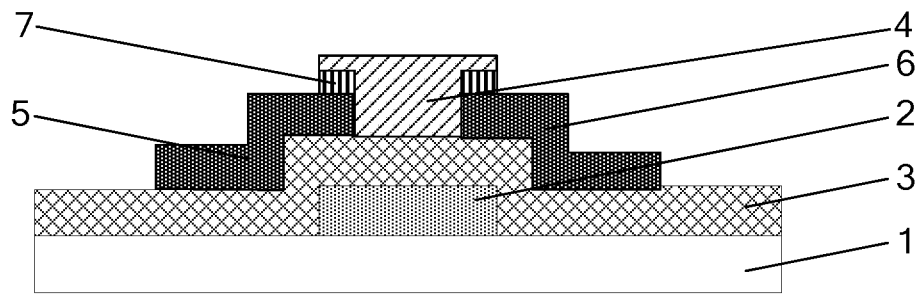
FIG. 1 is a schematic structural view of a thin film transistor according to an exemplary embodiment of the present invention.

1: substrate
2: gate electrode
3: gate insulation layer
4: active layer
5: source electrode
6: drain electrode
7: ohmic contact layer
8: finishing layer

DETAILED DESCRIPTION OF PREFERRED EMBODIMENTS OF THE INVENTION

Embodiments of the present invention will be described hereinafter in detail with reference the accompanying drawings. Obviously, the described embodiments are merely some of the embodiments of the disclosure, rather than all embodiments thereof. Based on the embodiments of the present invention, all other embodiments obtained by those skilled in the art without any inventive step will fall within the scope of the present invention.

An embodiment of the present invention provides a thin film transistor as shown in FIG. 1. The thin film transistor comprises a substrate 1, a gate electrode 2, a gate insulation layer 3, an active layer 4, a source electrode 5, a drain electrode 6 and an ohmic contact layer 7.

The ohmic contact layer 7 is disposed between the active layer 4 and the source electrode 5 and between the active layer 4 and the drain electrode 6.

The ohmic contact layer 7 is made of zinc nitride.

The ohmic contact layer in this embodiment is made of zinc nitride. The zinc nitride material has a good ohmic contact property. The ohmic contact layer is located between the active layer and the source and drain electrodes. The zinc nitride can generate large amounts of charges and has a good electrical conductivity. Therefore, the ohmic contract property between the active layer and the source and drain electrodes in the thin film transistor of the present embodiment is better than the ohmic contract property between the active layer and the source and drain electrodes in a structure in the prior art in which only the source and drain electrodes contact the active layer, so that there will not generate a relatively large signal delay in a display device having the thin film transistor, thereby avoiding a problem of poor image display quality.

Note that, FIG. 1 merely shows an exemplary embodiment of the present invention. In other embodiments, it is only necessary to ensure there is an ohmic contact layer of zinc nitride between the source and drain electrodes and the active layer in the thin film transistor. The active layer may be provided above or below the source and drain electrodes. The thin film transistor may be a top gate type or a bottom gate type.

The substrate may include a glass substrate, a quartz substrate or the like. The gate electrode may be made of metal material and the like. The gate insulation layer may be made of silicon nitride, or it may also be made of silicon oxide, silicon oxynitride and the like.

Figure 2:
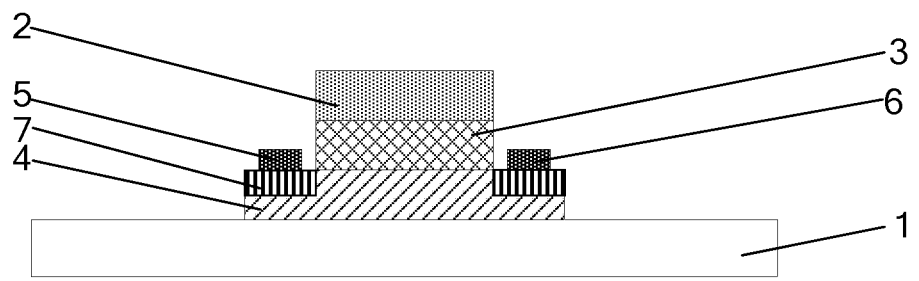
FIG. 2 is a schematic structural view of a thin film transistor according to another exemplary embodiment of the present invention.

FIG. 2 is a schematic structural view of a thin film transistor according to another exemplary embodiment of the present invention. With reference to FIG. 2, an active layer 4 of the thin film transistor is disposed on a substrate 1. A gate insulation layer 3 is disposed on the active layer 4 so that the active layer 4 is partially exposed. A gate electrode 2 is disposed on the gate insulation layer 3 at a position corresponding to the gate insulation layer 3. A source electrode 5 and a drain electrode 6 are disposed on an ohmic contact layer 7.

The active layer 4 may be made of zinc oxynitride and have a thickness of 200-1500 Å. Each of the source electrode 5 and the drain electrode 6 may have a thickness of 50-100 Å. The ohmic contact layer may have a thickness less than 50 Å. The ohmic contact layer 7 may be obtained by reaction of a metallic nitride or a nonmetallic nitride thin film formed between the active layer and the source and drain electrodes with the zinc oxide in the active layer.

Specifically, with the thin film transistor as shown in FIG. 2, in which the active layer is disposed in contact with the substrate, and then the gate insulation layer and the gate electrode are sequentially formed; the ohmic contact layer is provided on the active layer, and then the source electrode and the drain electrode are provided on the ohmic contact layer. Since the ohmc contact layer is formed through the reaction of the zinc oxynitride in the active layer with the nitride thin film, a thickness of a film layer is not additionally increased. Compared with a structure of a thin film transistor in the prior art, a width of a channel region of the thin film transistor is decreased, and an improved ohmic contact property between the active layer and the source and drain electrodes of the thin film transistor is ensured, which greatly reduces a size of the thin film transistor and saves manufacturing cost. At the same time, a single patterning process is used to form the gate insulation layer and the gate electrode during manufacturing, thereby reducing manufacturing steps.

Figure 3:
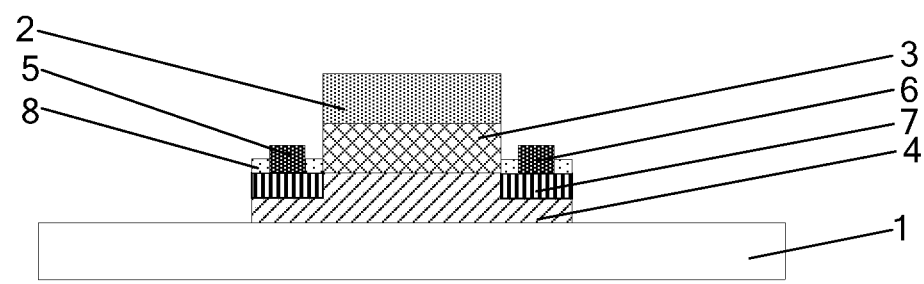
FIG. 3 is a schematic structural view of a thin film transistor according to yet another exemplary embodiment of the present invention.

FIG. 3 is a schematic structural view of a thin film transistor according to another exemplary embodiment of the present invention. Referring to FIG. 3, the thin film transistor further comprises a finishing layer 8.

The finishing layer 8 is disposed on the ohmic contact layer 7 and provided with via holes therein at positions corresponding to the source electrode 5 and the drain electrode 6.

The finishing layer 8 is made of metallic or nonmetallic nitride. For example, the finishing layer is made of aluminum nitride.

The finishing layer 8 may have a thickness of 30-300 Å. Preferably, the finishing layer 8 has a thickness of 30-120 Å.

According to an embodiment, a layer of nitride thin film is formed on the gate electrode to cover the substrate, the gate electrode and the active layer when initially forming the finishing layer. Since the nitride thin film directly contacts the active layer, the metallic or nonmetallic nitride thin film forming the finishing layer will chemically react with the zinc oxynitride of the active layer to produce zinc nitride so as to form the ohmic contact layer. That is, the ohmic contact layer is formed at a position where the nitride thin film is in contact with the active layer.

According to another embodiment of the present invention, the ohmic contact layer may be formed at a position corresponding to the active layer by directly forming a layer of zinc nitride thin film on the gate electrode by magnetron sputtering and then patterning the nitride thin film with a mask plate after various patterning processes such as exposure, development, etching, peeling and the like.

With the thin film transistor according to the above embodiments of the present invention, the ohmic contact layer made of the zinc nitride is formed between the active layer and the source electrode and the active layer and the drain electrode. Since the zinc nitride material has a good ohmic contact property, the ohmic contact layer made of zinc nitride will provide a good ohmic contact property between the source and drain electrodes and the active layer. Therefore, it is possible to solve the problem of poor ohmic contact effect between the active layer of zinc oxynitride and the source and drain electrodes, thereby improving the ohmic contact property between the active layer and the source and drain electrodes in the thin film transistor.

Meanwhile, compared to the prior art in which the gate electrode has a larger area than that of the active layer to ensure the performance of the thin film transistor, in the embodiments of the present invention, since the ohmic contact layer is additionally provided, an area of the gate electrode is greatly reduced compared to that of the prior art, which can in turn effectively reduce an area of the active layer such that a parasitic capacitance between the source and drain electrodes and the gate electrode is reduced. Therefore, it is possible to improve image display effect of a display comprising the thin film transistor of the present disclosure.

Figure 4:
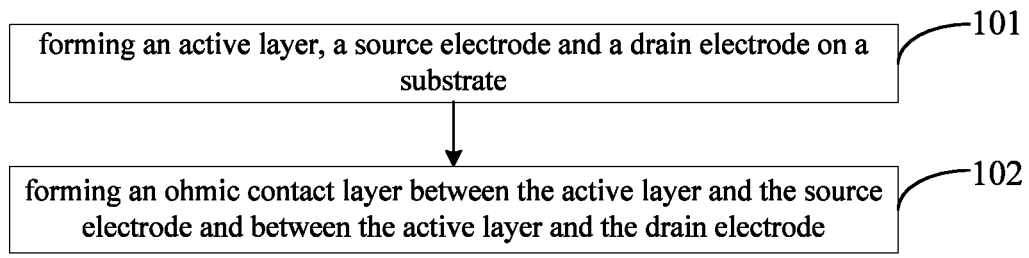
FIG. 4 is a schematic flow chart of a method for manufacturing a thin film transistor according to an exemplary embodiment of the present invention.

In another embodiment of the present invention, there is provided a method for manufacturing a thin film transistor. As shown in FIG. 4, the method comprises:

S101: forming an active layer, a source electrode and a drain electrode on a substrate.

Specifically, depositing a thin film of zinc oxynitride having a thickness of 200-1500 Å on a substrate such as a glass substrate or a quartz substrate through a chemical vapor deposition process and then performing a single patterning process on the thin film of zinc oxynitride to form the active layer, and thereafter, depositing a layer of metal thin film on the active layer. The metal thin film is typically selected from a group consisting of molybdenum, aluminum, aluminum-nickel alloy, molybdenum tungsten alloy, chromium, copper or the combination thereof. Then, forming a source electrode and a drain electrode on predetermined regions by a patterning process. Each of the finally formed source and drain electrodes may have a thickness of 50-100 Å.

Note that, there is not any limitation to the order of forming the active layer and the source and drain electrodes. It is possible to firstly form the active layer and then form the source and drain electrodes. Alternatively, it is possible to firstly form the source and drain electrodes and then form the active layer.

S102: forming an ohmic contact layer between the active layer and the source electrode and between the active layer and the drain electrode.

Specifically, it is possible to form a thin film of zinc nitride having a thickness less than 50 Å on the substrate through a magnetron sputtering process, and then to form the ohmic contact layer on a predetermined region of the substrate through patterning processes such as exposure, development, etching, peeling and the like by using a mask plate.

Figure 5:
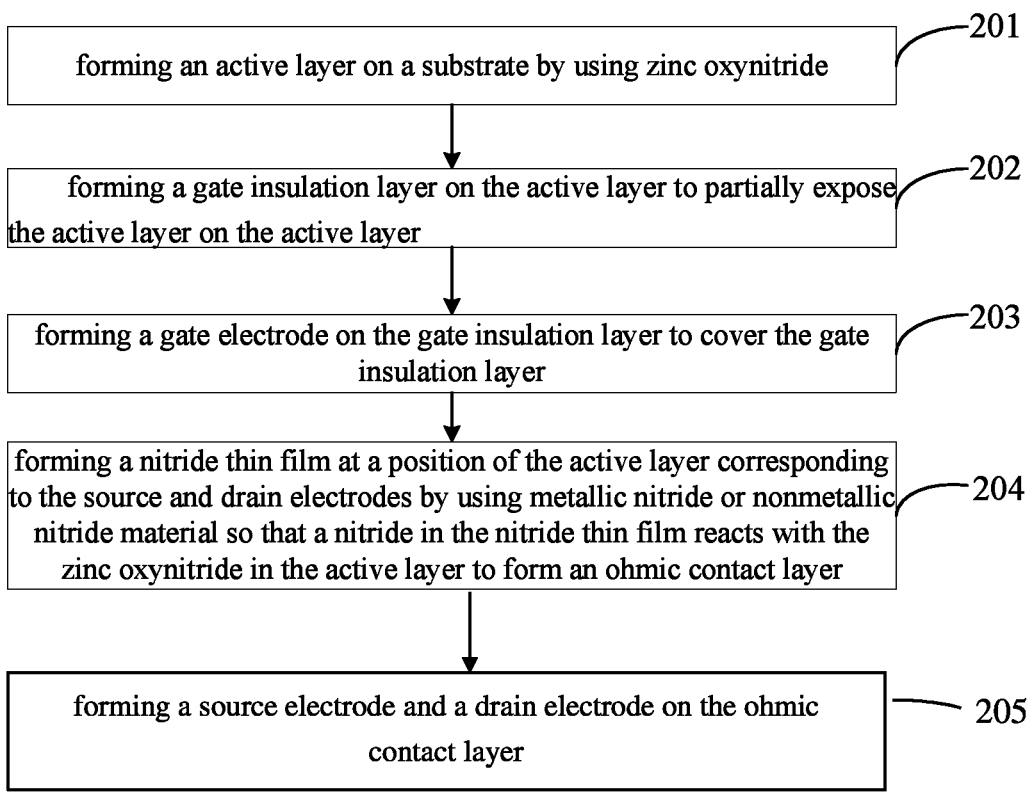
FIG. 5 is a schematic flow chart of a method for manufacturing a thin film transistor according to another exemplary embodiment of the present invention.

In yet another embodiment of the present invention, there is provided a method for manufacturing a thin film transistor. With reference to FIG. 5, the method comprises:

S201: forming an active layer on a substrate by using zinc oxynitride.

Specifically, it is possible to deposit a thin film of zinc oxynitride having a thickness of 200-1500 Å on a substrate such as a glass substrate or a quartz substrate through a chemical vapor deposition process and then perform a single patterning process on the thin film of zinc oxynitride to form the active layer. That is, after applying a photoresist layer, performing exposure, development and etching processes on the substrate to form the active layer by using a mask plate.

S202: forming a gate insulation layer on the active layer to partially expose the active layer on the active layer;

S203: forming a gate electrode on the gate insulation layer to cover the gate insulation layer.

As to steps S202 and S203, specifically, it is possible to deposit an insulation thin film on the active layer through a chemical vapor deposition process or a magnetron sputtering process. The insulation thin film is typically made of silicon nitride. It may also be made of silicon oxide, silicon oxynitride or the like.

Further, it is possible to deposit a layer of metal thin film on the insulation thin film through a magnetron sputtering process. The metal thin film is typically formed by molybdenum, aluminum, aluminum-nickel alloy, molybdenum tungsten alloy, chromium, copper or the combination thereof.

Then, the insulation thin film and the metal thin film are processed to form the gate insulation layer on a predetermined region of the active layer for partially exposing the active layer and the gate electrode through a single patterning process such as exposure, development, etching, peeling and the like.

S204: forming a nitride thin film at a position of the active layer corresponding to the source and drain electrodes by using metallic nitride or nonmetallic nitride material so that a nitride in the nitride thin film reacts with the zinc oxynitride in the active layer to form an ohmic contact layer.

Specifically, it is possible to deposit a layer of thin film of nitride covering the substrate, the gate electrode and the active layer and having a thickness of 30-300 Å on the gate electrode through a magnetron sputtering process. Then, the nitride thin film will react with the zinc oxynitride in the active layer to form a thin film of zinc nitride, i.e., the ohmic contact layer having a thickness less than 50 Å on a predetermined region of the active layer.

S205: forming a source electrode and a drain electrode on the ohmic contact layer.

Specifically, it is possible to deposit a metal thin film having a thickness of 50-100 Å on the ohmic contact layer by the same process as that for forming the gate electrode, and then to form the source and drain electrodes on a predetermined region through a patterning process.

Figure 6:
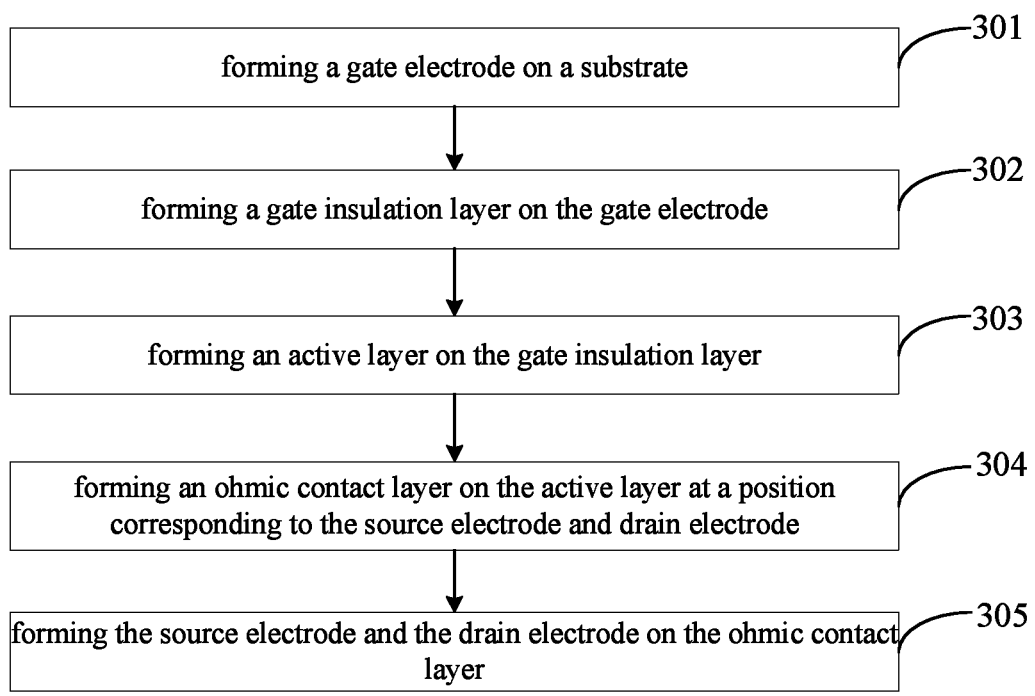
FIG. 6 is a schematic flow chart of a method for manufacturing a thin film transistor according to yet another exemplary embodiment of the present invention.

In further another embodiment of the present invention, there is provided a method for manufacturing a thin film transistor. With reference to FIG. 6, the method comprises:

S301: forming a gate electrode on a substrate.

Specifically, it is possible to deposit a layer of metal thin film on a substrate such as a glass substrate or a quartz substrate by a magnetron sputtering process. The metal thin film may typically formed by molybdenum, aluminum, aluminum-nickel alloy, molybdenum tungsten alloy, chromium, copper or the combination thereof. Then, it is possible to form the gate electrode on a predetermined region of the substrate through patterning processes such as exposure, development, etching, peeling and the like by using a mask plate.

S302: forming a gate insulation layer on the gate electrode.

Specifically, it is possible to deposit a gate electrode insulation layer thin film on the glass substrate through a chemical vapor deposition process. The gate insulation layer thin film is typically made of silicon nitride. It may also be made of silicon oxide, silicon oxynitride and the like.

S303: forming an active layer on the gate insulation layer.

Specifically, it is possible to deposit a zinc oxynitride layer having a thickness of 200-1500 Å on the gate insulation layer, and then process the zinc oxynitride layer by a patterning process to form the active layer.

S304: forming an ohmic contact layer on the active layer at a position corresponding to the source electrode and drain electrode.

Specifically, it is possible to form a metallic or nonmetallic nitride thin film having a thickness of 30-300 Å and covering an ohmic contact region of the active layer on the active layer through a patterning process. For example, the thin film is made of aluminum nitride. Then, the nitride thin film reacts with the zinc oxynitride in the active layer to form a zinc nitride thin film, i.e., the ohmic contact layer having a thickness less than 50 Å at a position of the active layer in contact with source and drain electrodes.

S305: forming the source electrode and the drain electrode on the ohmic contact layer.

Specifically, it is possible to deposit a metal thin film similar to a gate electrode metal having a thickness of 50-100 Å on the substrate by the same process as that for forming the gate electrode metal layer, and then to form the source and drain electrodes on a predetermined region through a patterning process.

According to still another embodiment of the present invention, there is provided a display substrate comprising the thin film transistor as described in the above embodiments of the present invention.

With the display substrate according to the embodiments of the present invention, an ohmic contact layer is formed in the thin film transistor between the active layer and the source electrode and between the active layer and the drain electrode by using zinc nitride material. Since the zinc nitride material has a good ohmic contact property, the ohmic contact layer made of the zinc nitride will provide a good ohmic contact property between the source and drain electrodes and the active layer. Therefore, it is possible to solve the problem of poor ohmic contact effect between the active layer of zinc oxynitride and the source and drain electrodes in the prior art, thereby improving the ohmic contact property between the active layer and the source and drain electrodes.

On the other hand, compared to the prior art in which the gate electrode has a larger area than that of the active layer to ensure the performance of the thin film transistor, in the embodiments of the present invention, since the ohmic contact layer is additionally provided, an area of the gate electrode is greatly reduced compared to that of the prior art, which can in turn effectively reduce an area of the active layer such that a parasitic capacitance between the source and drain electrodes and the gate electrode is reduced. Therefore, the display substrate having the thin film transistor as described above improves image display effect of a display.

Embodiments of the present invention also provide a display device comprising the display substrate as described in the above embodiments of the present invention.

The above discussions are merely the embodiments of the present invention, and the scope of the present invention is not limited thereto. Various changes or modifications easily envisaged by those skilled in the art based on the present disclosure should fall within the scope of the present invention. For example, although various embodiments of the present invention are described by taking the active layer made of zinc oxynitride material and the ohmic contact layer made of the zinc nitride material as an example, it should be understood that the materials of the active layer and the ohmic contact layer are not limited thereto as long as the materials are beneficial to improve the ohmic contact property between the active layer and the source electrode and/or the drain electrode. Therefore, the scope of the present invention should be defined solely by the appended claims.

What is claimed is:

1. A thin film transistor comprising
   an active layer;
   a source electrode;
   a drain electrode; and
   an ohmic contact layer,
   wherein the ohmic contact layer is disposed between the active layer and the source electrode and/or between the active layer and the drain electrode to improve an ohmic contact property between the active layer and the source electrode and/or between the active layer and the drain electrode;
   wherein the active layer is made of zinc oxynitride; and
   wherein the ohmic contact layer is made of zinc nitride.

2. The thin film transistor according to claim 1, further comprising a gate insulation layer and a gate electrode, wherein
- the active layer is disposed on a substrate;
- the gate insulation layer is disposed on the active layer to partially expose the active layer;
- the gate electrode is disposed on the gate insulation layer at a position corresponding to the gate insulation layer;
- the ohmic contact layer is disposed on the exposed active layer; and
- the source electrode and the drain electrode are disposed on the ohmic contact layer.

3. The thin film transistor according to claim 1, further comprising a finishing layer, wherein
- the finishing layer is disposed on the ohmic contact layer and provided with via holes at positions corresponding to the source electrode and the drain electrode therein; and
- the finishing layer is made of metallic or nonmetallic nitride.

4. The thin film transistor according to claim 1, wherein the active layer has a thickness of 200-1500 Å.

5. The thin film transistor according to claim 1, wherein each of the source electrode and the drain electrode has a thickness of 50-100 Å.

6. The thin film transistor according to claim 1, wherein the ohmic contact layer has a thickness less than 50 Å.

7. The thin film transistor according to claim 4, wherein the finishing layer has a thickness of 30-300 Å.

8. A method for manufacturing a thin film transistor comprising an active layer, a source electrode and a drain electrode, the method comprising:
- forming an ohmic contact layer between the active layer and the source electrode and/or between the active layer and the drain electrode,
- wherein the active layer is made of zinc oxynitride, and the ohmic contact layer is made of zinc nitride.

9. The method according to claim 8, further comprising
- forming the active layer on a substrate by using zinc oxynitride material;
- forming a gate insulation layer on the active layer to partially expose the active layer;
- forming a gate electrode on the gate insulation layer to cover the gate insulation layer;
- forming the ohmic contact layer on the exposed active layer; and
- forming the source electrode and the drain electrode on the ohmic contact layer.

10. The method according to claim 8, wherein the forming an ohmic contact layer between the active layer and the source electrode and/or between the active layer and the drain electrode comprises:
- forming a nitride thin film between the active layer and the source electrode and/or between the active layer and the drain electrode by using a metallic or nonmetallic nitride material so that a nitride in the nitride thin film reacts with the zinc oxynitride in the active layer to form the ohmic contact layer.

11. The method according to claim 8, wherein the forming an ohmic contact layer between the active layer and the source electrode and/or between the active layer and the drain electrode comprises:
- forming the ohmic contact layer between the active layer and the source electrode and/or between the active layer the drain electrode directly by using a zinc nitride material.

12. The method according to claim 9, further comprising
- forming the gate insulation layer and the gate electrode through a single patterning process.

13. A display substrate comprising the thin film transistor according to claim 1.

14. A display device comprising the display substrate according to claim 13.

15. The thin film transistor according to claim 2, further comprising a finishing layer, wherein
- the finishing layer is disposed on the ohmic contact layer and provided with via holes at positions corresponding to the source electrode and the drain electrode therein; and
- the finishing layer is made of metallic or nonmetallic nitride.

16. The thin film transistor according to claim 2, wherein the active layer has a thickness of 200-1500 Å.

17. The thin film transistor according to claim 2, wherein each of the source electrode and the drain electrode has a thickness of 50-100 Å.

18. The thin film transistor according to claim 2, wherein the ohmic contact layer has a thickness less than 50 Å.

* * * * *